(12) United States Patent
Young et al.

(10) Patent No.: US 12,289,892 B2
(45) Date of Patent: Apr. 29, 2025

(54) MEMORY DEVICE STRUCTURE AND MANUFACTURING METHOD THEREOF

(71) Applicant: Taiwan Semiconductor Manufacturing Company, Ltd., Hsinchu (TW)

(72) Inventors: Bo-Feng Young, Taipei (TW); Sai-Hooi Yeong, Hsinchu County (TW); Yu-Ming Lin, Hsinchu (TW); Chao-I Wu, Hsinchu County (TW); Mauricio Manfrini, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 622 days.

(21) Appl. No.: 17/169,554

(22) Filed: Feb. 8, 2021

(65) Prior Publication Data
US 2021/0408013 A1   Dec. 30, 2021

Related U.S. Application Data

(60) Provisional application No. 63/045,194, filed on Jun. 29, 2020.

(51) Int. Cl.
*G11C 11/16* (2006.01)
*H10B 51/30* (2023.01)
(Continued)

(52) U.S. Cl.
CPC ............ *H10B 51/30* (2023.02); *G11C 11/161* (2013.01); *H10B 61/22* (2023.02);
(Continued)

(58) Field of Classification Search
CPC .............. G11C 11/161; G11C 11/2275; G11C 11/1675; G11C 11/1659; G11C 11/2259;
(Continued)

(56) References Cited

U.S. PATENT DOCUMENTS 6,114,719 A  *  9/2000  Dill .................... H10N 50/10
                                                    365/158
2016/0293227 A1 * 10/2016 Chi ...................... G11C 5/025
(Continued)

*Primary Examiner* — Shaun M Campbell
*Assistant Examiner* — Teresa M. Arroyo
(74) *Attorney, Agent, or Firm* — JCIPRNET

(57) ABSTRACT

A memory device and a manufacturing method are provided. The memory device includes a substrate, a transistor, and a memory cell. The substrate has a semiconductor device and a dielectric structure disposed on the semiconductor device. The transistor is disposed over the dielectric structure and is electrically coupled with the semiconductor device. The semiconductor device includes a gate, a channel layer, source drain regions, and a stack of a gate dielectric layer and a first ferroelectric layer. The gate and the source and drain regions are disposed over the dielectric structure. The channel layer is located between the source and drain regions. The stack of the gate dielectric layer and the first ferroelectric layer is disposed between the gate and the channel layer. The memory cell is disposed over the transistor and is electrically connected to one of the source and drain regions. The memory cell includes a ferromagnetic layer or a second ferroelectric layer.

20 Claims, 14 Drawing Sheets

(51) Int. Cl.
    *H10B 61/00*     (2023.01)
    *H10D 30/01*     (2025.01)
    *H10D 30/69*     (2025.01)
    *H10N 50/01*     (2023.01)
    *H10N 50/10*     (2023.01)
    *H10N 50/80*     (2023.01)

(52) U.S. Cl.
    CPC ....... *H10D 30/0415* (2025.01); *H10D 30/701* (2025.01); *H10N 50/01* (2023.02); *H10N 50/10* (2023.02); *H10N 50/80* (2023.02)

(58) Field of Classification Search
    CPC ........... H01L 29/6684; H01L 29/78391; H01L 29/40111; H01L 28/40; H10B 61/22; H10B 51/30; H10N 50/10; H10N 50/01; H10N 50/80
    USPC ........................................................ 257/295
    See application file for complete search history.

(56) References Cited

U.S. PATENT DOCUMENTS

| | | | |
|---|---|---|---|
| 2017/0317302 A1* | 11/2017 | Chang | H10K 10/486 |
| 2019/0019551 A1* | 1/2019 | Lee | G11C 13/0069 |
| 2019/0058049 A1* | 2/2019 | Then | H01L 29/7786 |
| 2020/0091274 A1* | 3/2020 | Sharma | H01L 29/4908 |
| 2020/0098926 A1* | 3/2020 | Sharma | H01L 29/78391 |
| 2020/0373312 A1* | 11/2020 | Sharma | G11C 11/223 |
| 2021/0043828 A1* | 2/2021 | Hong | H10B 63/80 |
| 2021/0242225 A1* | 8/2021 | Manfrini | H10B 53/00 |
| 2021/0375887 A1* | 12/2021 | Doornbos | H10B 51/30 |
| 2021/0375891 A1* | 12/2021 | Young | H01L 23/5226 |
| 2021/0399141 A1* | 12/2021 | Li | H01L 29/7869 |

\* cited by examiner

MEMORY DEVICE STRUCTURE AND MANUFACTURING METHOD THEREOF

CROSS-REFERENCE TO RELATED APPLICATION

This application claims the priority benefit of U.S. provisional applications Ser. No. 63/045,194, filed on Jun. 29, 2020. The entirety of the above-mentioned patent application is hereby incorporated by reference herein and made a part of this specification.

BACKGROUND

Two types of memories, volatile memory and non-volatile memory, are widely used in electronic products. Volatile memory loses the data stored in the memory when the power is lost, while non-volatile memory keeps the data stored in the memory when there is no power.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
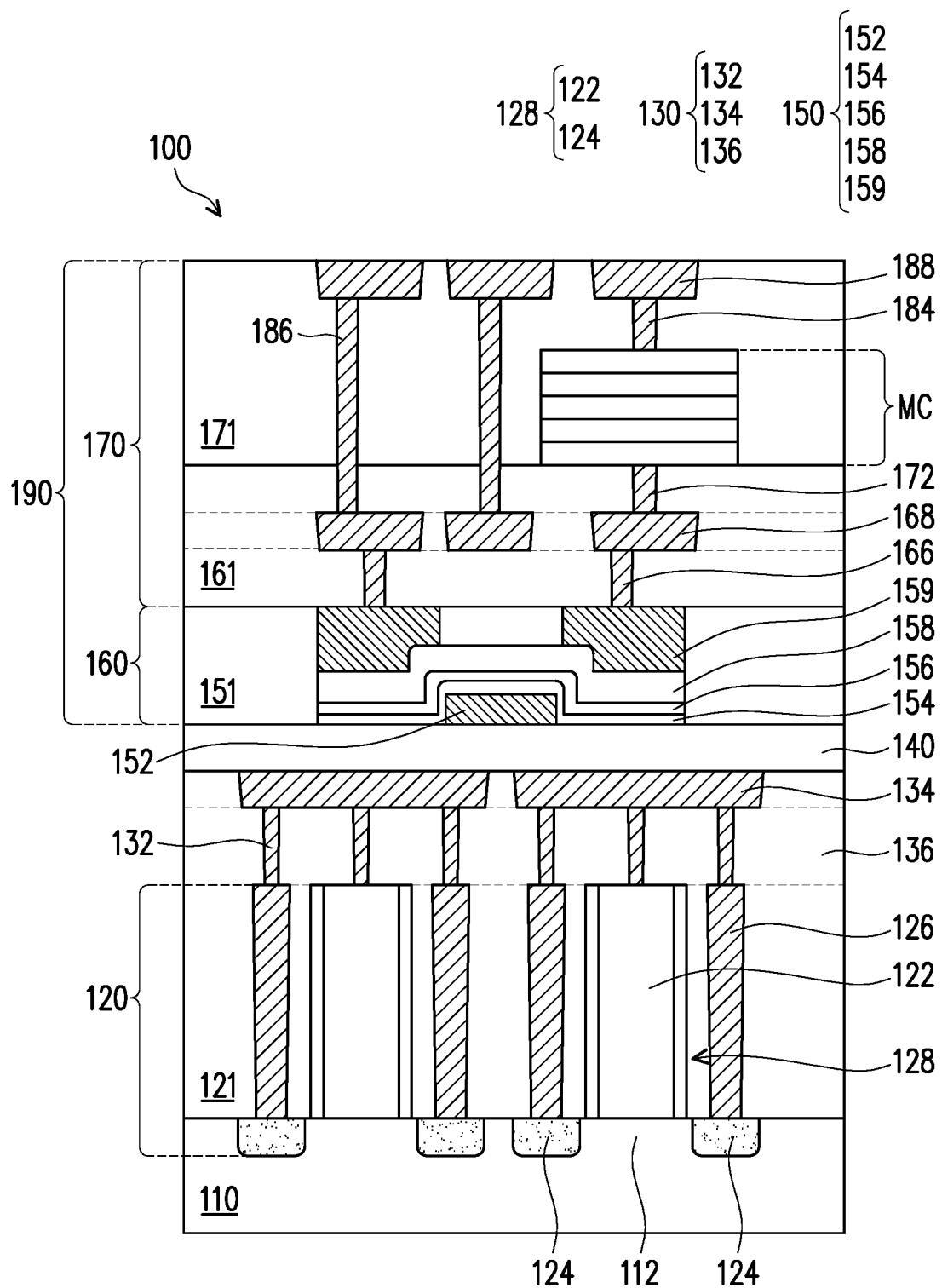
FIG. 1 is a schematic cross-sectional view illustrating a memory structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

FIG. 1 shows an example of a semiconductor structure 100 according to some embodiments. Referring to FIG. 1, the semiconductor structure 100 includes a substrate 110, a device layer 120, an interconnection structure 130, a dielectric structure 140, a transistor layer 160, and a memory layer 170. Specifically, as shown in FIG. 1, the device layer 120 disposed on the substrate 110 includes semiconductor devices 128 formed therein. In some embodiments, the substrate 110 includes a semiconductor substrate. In one embodiment, the substrate 110 comprises a crystalline silicon substrate or a doped semiconductor substrate (e.g., p-type semiconductor substrate or n-type semiconductor substrate). In some alternative embodiments, the substrate 110 includes a semiconductor substrate made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

As shown in FIG. 1, the device layer 120 includes semiconductor devices 128 such as metal-oxide-semiconductor field effect transistors (MOSFETs) embedded in a dielectric layer 121 on the substrate 110. In some embodiments, the MOSFETs include NMOS and PMOS formed following the complementary MOS (CMOS) processes. In certain embodiments, the semiconductor devices 128 are formed by the front-end-of-line (FEOL) processes and may be considered as FEOL devices. In some embodiments, the semiconductor device 128 includes a gate structure 122 located on the substrate 110, source and drain regions 124 formed as doped regions in the substrate 110 and a channel region 112 between the source and drain regions 124. In some embodiments, the device layer 120 further includes, but is not limited thereto, other types of transistors, capacitors, resistors, or the like. The semiconductor devices 128 in the device layer 120 are electrically connected with the above interconnection structure 130. In some embodiments, the interconnection structure 130 includes conductive lines 134 and conductive vias 132 embedded in an insulating layer 136 for interconnecting the semiconductor devices 128 and for electrically connecting the semiconductor devices 128 with other above layers. In some embodiments, the conductive vias 132 electrically connects to the gate structure 122 directly. In some embodiments, the conductive vias 132 electrically connects to the source and drain regions 124 through the conductive vias 126 in the device layer 120.

In some embodiments, a dielectric structure 140 is formed over and disposed on the interconnection structure 130 and the device layer 120. In FIG. 1, although the dielectric structure 140 is shown as a single layer, but the dielectric structure 140 may include multiple dielectric layers and further metallization layers or conductive patterns may be embedded in the dielectric structure 140 for electrically connecting the underlying semiconductor devices 128 with the transistor(s) located in the above layers. In some embodiments, a transistor layer 160 including a dielectric layer 151 and at least a thin film transistor (TFT) is formed over and disposed on the dielectric structure 140. In some embodiments, the transistor 150 in the transistor layer 160 is disposed on the dielectric structure 140 and electrically coupled with the underlying semiconductor device(s) 128, and the dielectric layer 151 at least laterally surrounds the transistor 150. In some embodiments, the thin film transistor 150 includes a gate electrode 152 disposed on the dielectric structure 140, a ferroelectric layer 154, a gate dielectric layer 156 and a channel layer 158 stacked on the gate electrode 152, and source and drain regions 159 disposed on the channel layer 158. In FIG. 1, the channel layer 158 extends between the source and drain regions 159. In some embodiments, the ferroelectric layer 154 and the gate dielectric layer 156 form a stack and such stack is disposed between the gate electrode 152 and the channel layer 158. Although only one transistor layer 160 is shown in FIG. 1 and only one transistor 150 is shown in the transistor layer 160, it is well understood that multiple tiers or layers of transistor layer may be formed and more transistors may be included in the transistor layer. In some embodiments, at least one thin film transistor 150 is a negative capacitance field effect transistor (NCFET). The NCFET includes a thin-layer of ferroelectric (FE) material on the gate oxide layer of a MOSFET, but different from the ferroelectric FET (Fe-FET) showing a ferroelectric hysteresis, the NCFET has an anti-clockwise hysteresis or zero-hysteresis. As the transistor(s) 150 is a NCFET, the on-current ($I_{on}$) may be reached at a lower supply voltage ($V_{DD}$) and the power consumption is reduced.

It is understood that the transistor 150 may include other types of transistors in various embodiments, the transistor 150 may be referred to as a NCFET 150 herein for description purposes.

In some embodiments, in FIG. 1, the memory layer 170 is formed over and disposed on the transistor layer 160. In some embodiments, the memory layer 170 includes a memory cell MC electrically connected to one of source and drain regions 159 of the NCFET 150. In some embodiments, the memory cell MC includes a magnetic tunnel junction (MTJ) structure. In some embodiments, the memory cell MC includes a ferroelectric tunnel junction (FTJ) structure. In some embodiments, one of the source and drain regions 159 of the NCFET 150 is electrically connected with the memory cell MC through conductive vias 166, conductive lines 168 and conductive via 172 embedded in a dielectric layer 161. The other one of the source and drain regions 159 of the NCFET 150 is electrically connected with the conductive lines 188 through the conductive vias 166, conductive lines 168, conductive via 172, and conductive vias 186 embedded in the dielectric layers 161, 171, and the memory cell MC is electrically connected with the conductive lines 188 through the conductive via 184. As shown in FIG. 1, the conductive vias 166, 172, 184, 186, and the conductive lines 168, 188 are part of the metallization structures of the memory layer 170. In some embodiments, the transistor 150 in the transistor layer 160 and the memory cell MC in the memory layer 170 form a memory device 190.

A magneto-resistive random-access memory (MRAM) includes a transistor and a magnetic tunnel junction (MTJ) structure. In certain embodiments, the memory cell MC includes an MTJ structure, the transistor 150 (i.e. NCFET) and the memory cell MC (e.g. MTJ) together form a memory device 190 (i.e. MRAM device).

By applying an external magnetic field to the MTJ, the magnetization of the MTJ switches from a low resistance state to a high resistance state or vice versa. Therefore, the property of switching between two resistance states makes MTJ a leading candidate of a next generation of non-volatile memory. In order to better distinguish the low resistance state and the high resistance state of the MTJ, the transistor needs to output a larger current to the MTJ to generate a larger voltage across the MTJ. However, a larger the on-current of the transistor requires applying a large gate voltage to the transistor, which limits the performance of the transistor. Therefore, it is desirable that the transistor may output a large current at a lower gate voltage applied to the transistor. As the transistor is a NCFET, larger on-current ($I_{on}$) is offered at the same or even lower gate voltage.

For example, in the NCFET 150 of the transistor layer 160, the ferroelectric layer 154 located between the gate electrode 152 and the gate dielectric layer 156 is in contact with the gate electrode 152 and laterally wraps around the gate electrode 152. Through the proper combination of the ferroelectric layer and the gate dielectric layer, the ferroelectric layer 154 and the gate dielectric layer 156 together may generate a negative capacitance (NC) effect, which offers a larger on current $I_{on}$ of the NCFET 150 under the same gate voltage or even at a lower voltage applied to the NCFET 150. In some embodiments, the on-current $I_{on}$ of the NCFET 150 may be increased by a factor of 2 to 10 under the same gate voltage applied to the NCFET 150. For achieving the desired negative capacity of the NCFET, suitable materials of the ferroelectric layer 154 and the gate dielectric layer 156 are chosen and the thicknesses of the ferroelectric layer 154 and the gate dielectric layer 156 are finely tuned or modified depending on the desirable value of the negative capacity. In some embodiments, the material of the ferroelectric layer 154 includes $HfO_2$, $HfZrO_2$, or $HfO_2$ doped with silicon, germanium (Ge), lanthanum (La), aluminum (Al), yttrium (Y), strontium (Sr) or zirconium (Zr) or the combinations thereof. In some embodiments, the material of the ferroelectric layer 154 includes lead zirconate titanate (PZT), aluminum nitride (AlN) or aluminum scandium nitride (AlScN). In some embodiments, the material of the gate dielectric layer 156 includes silicon oxide, aluminum oxide, silicon oxynitride, silicon nitride, silicon carbon nitride (SiCN), silicon oxycarbonitride (SiOCN) or the like. By adjusting the materials and the combination(s) of the ferroelectric layer 154 and the gate dielectric layer 156, the negative capacitance effect may be fine-tuned to achieve the satisfactory performance. In some embodiments, the ratio of the thickness of the ferroelectric layer 154 and of the gate dielectric layer 156 ranges between about 0.1 to about 1. In some alternative embodiments, the ratio of the thickness of the ferroelectric layer 154 and of the gate dielectric layer 156 ranges between about 10 to about 1.

A ferroelectric random-access memory (FeRAM) includes a transistor and a ferroelectric tunnel junction (FTJ) structure. FeRAM stores information using the spontaneous polarization of the ferroelectric material. In certain embodiments, the memory cell MC includes an FTJ structure, the transistor 150 (i.e. NCFET) and the memory cell MC (e.g. FTJ) together form a memory device 190 (i.e. FeRAM device).

In some embodiments, for the memory device 190, the memory cell MC in the memory layer 170 may include a ferroelectric tunnel junction (FTJ) structure. The FTJ structure is a tunnel junction in which two metal electrodes are separated by a thin ferroelectric layer. The spontaneous polarization of the ferroelectric layer can be switched by an applied electric field. The electrical resistance of an FTJ strongly depends on the orientation of the electric polarization. Similarly, when the FTJ is coupled with the NCFET 150, NCFET 150 provides a larger $I_{on}$ to the FTJ to switch the resistance state of the FTJ by switching the polarization of the ferroelectric layer of the FTJ, and the memory performance is enhanced.

FIG. 2 to FIG. 11 are schematic cross-sectional views showing the structure at various stages of a method for manufacturing a memory structure according to some exemplary embodiments of the present disclosure.

Figure 2:
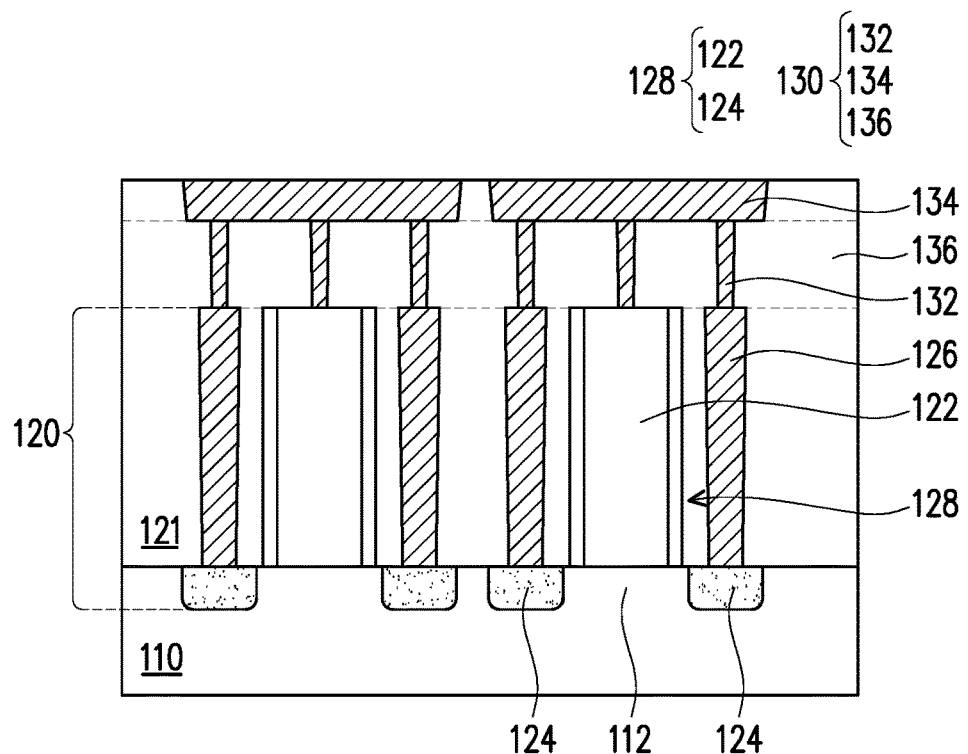
FIG. 2 to FIG. 11 are schematic cross-sectional views showing the structure at various stages of a method for manufacturing a memory structure according to some exemplary embodiments of the present disclosure.

Referring to FIG. 2, in some embodiments, a substrate 110 is provided and doped regions are formed in the substrate 110. Later, a device layer 120 is formed over the substrate 110, and an interconnection structure 130 is formed over the device layer 120. In some embodiments, as shown in FIG. 2, the device layer 120 disposed on the substrate 110 includes semiconductor devices 128 formed therein. In some embodiments, the substrate 110 includes a semiconductor substrate. In one embodiment, the substrate 110 comprises a crystalline silicon substrate or a doped semiconductor substrate (e.g., p-type semiconductor substrate or n-type semiconductor substrate). In some alternative embodiments, the substrate 110 includes a semiconductor substrate made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

As shown in FIG. 2, the device layer 120 includes semiconductor devices 128 such as metal-oxide-semiconductor field effect transistors (MOSFETs) embedded in a dielectric layer 121 on the substrate 110. In some embodiments, the MOSFETs include NMOS and PMOS formed following the complementary MOS (CMOS) processes. In certain embodiments, the semiconductor devices 128 are formed by the front-end-of-line (FEOL) processes and may be considered as FEOL devices. In some embodiments, the formation of the semiconductor device 128 includes forming a gate structure 122 located on the substrate 110 and between source and drain regions 124 formed as doped regions in the substrate 110. In addition, the dielectric layer 121 is formed over the substrate 100 covering the gate structure 122 and conductive vias 126 are formed on the source and drain regions 124 penetrating through the dielectric layer 121. In some embodiments, a channel region 112 extends between the source and drain regions 124. In some embodiments, the device layer 120 further includes, but is not limited thereto, other types of transistors, capacitors, resistors, or the like. In some embodiments, the gate structure 122 includes a gate electrode and a gate dielectric layer.

In some embodiments, the dielectric layer 121 in the device layer 120 may be referred as interlayer dielectric (ILD) layer. In some embodiments, the material of the dielectric layer 121 includes silicon oxide, silicon nitride, silicon oxynitride, phosphosilicate glass (PSG), borosilicate glass (BSG), boron-doped phosphosilicate glass (BPSG), or low-k materials. The dielectric layer 121 may be formed by any acceptable deposition process, such as spin coating, chemical vapor deposition (CVD), or other suitable methods.

In some embodiments, after forming the device layer 120, an insulating layer 136 is formed on the device layer 120, and the conductive vias 132 are formed in the insulating layer 136, and conductive lines 134 are formed on the insulating layer 136. The semiconductor device 128 of the device layer 120 electrically connects to the conductive lines 134 though the conductive vias 126, 132. In one embodiment, the conductive vias 132 and the conductive lines 134 are parts of the interconnection structure 130. In some embodiments, the material of the conductive vias 126, 132 and the conductive lines 134 may include a metal, such as copper, titanium, tungsten, aluminum, or a combination thereof. The conductive vias 126, 132 and the conductive lines 134 may be formed by CVD or plating. In some embodiments, the insulating layer 136 may be referred to as an interlayer dielectric (ILD) layer, and the material of the insulating layer 136 includes silicon oxide, silicon nitride, silicon oxynitride, or one or more low-k dielectric materials. In some embodiments, the insulating layer 136 is formed by CVD, spin-on coating, or other suitable methods. In some embodiments, the formation of the interconnection structure 130 includes the processes for forming one or more insulating layers and forming metal patterns in alternation and uses the back-end-of-line processes.

In some embodiments, such as FIG. 2, the gate structure 122 and the source and drain structures 124 of the semiconductor devices 128 are electrically connected to the conductive lines 134 at the same level of the metallization layer(s) of the interconnection structure 130. In some embodiments, the number of levels of the metallization layers in the interconnection structure 130 may be more than one, and the gate structure 122 and the source and drain structures 124 may connect to conductive lines 134 at different levels of the metallization layer.

Figure 3:
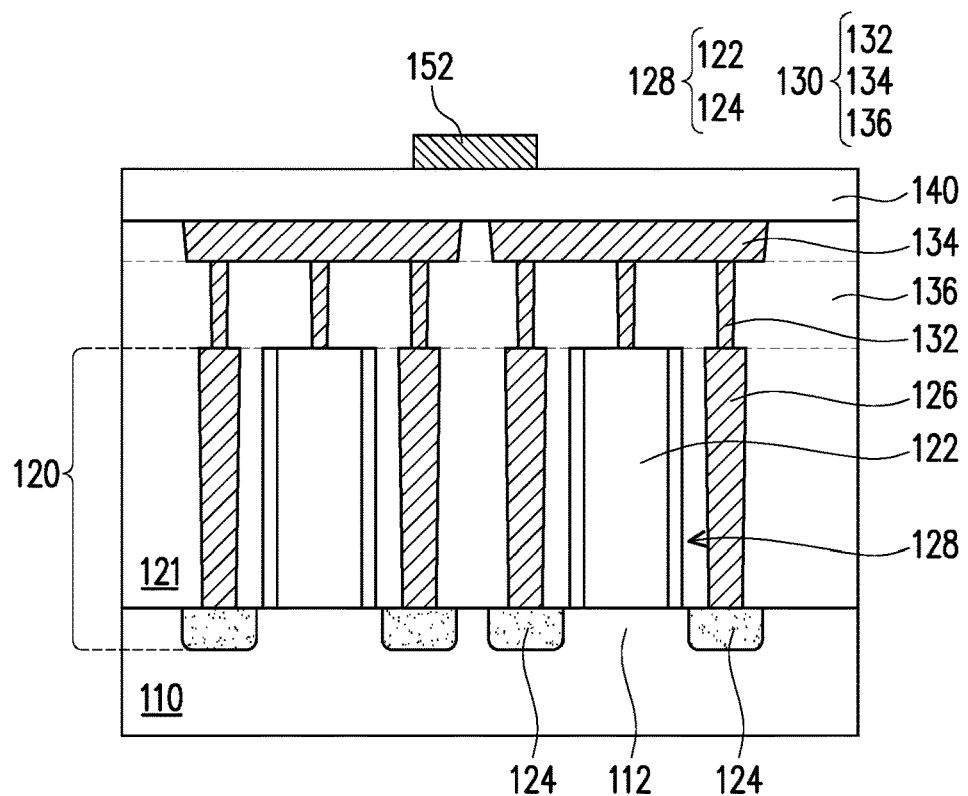

Referring to FIG. 3, a dielectric structure 140 is formed over the interconnection structure 130. In FIG. 3, although the dielectric structure 140 is shown as a single layer, but the dielectric structure 140 may include multiple dielectric layers formed of the same or different dielectric materials. In some embodiments, the dielectric structure is formed with metallization layers or conductive patterns (not shown) embedded therein for electrically connecting the underlying semiconductor devices 128 with the subsequently formed transistor(s) located in the above layers. In some embodiments, the dielectric structure 140 may be formed of the same material as that of the insulating layer 136. In some embodiments, the dielectric structure 140 may be formed of a different material from that of the insulating layer 136.

In some embodiments, the dielectric structure 140 may be formed blanketly over the substrate 110 and fully covering the underlying interconnection structure 130 and the device layer 120. In some embodiments, the material of the dielectric structure 140 includes silicon oxide, silicon nitride, silicon oxynitride, or one or more low-k dielectric materials. Examples of low-k dielectric materials include silicate glass such as fluoro-silicate-glass (FSG), phospho-silicate-glass (PSG) and boro-phospho-silicate-glass (BPSG), BLACK DIAMOND®, SILK®, FLARE®, hydrogen silsesquioxane (HSQ), fluorinated silicon oxide (SiOF), amorphous fluorinated carbon, parylene, BCB (bis-benzocyclobutenes), or a combination thereof. In some embodiments, the dielectric structure 140 is formed to a suitable thickness through CVD, spin-on coating, or other suitable methods. For example, an interlayer dielectric material (not shown) may be formed by PECVD over the substrate 110, and then an etching or polishing process may be performed to reduce the thickness of the interlayer dielectric material until a desirable thickness to form the dielectric structure 140.

As shown in FIG. 3, in some embodiments, a gate electrode 152 is formed on the dielectric structure 140. In some embodiments, the formation of the gate electrode 152 includes forming a metallic layer (not shown) over the dielectric structure and then patterning the metallic layer into the gate electrode 152. In some embodiments, the material of the metallic layer includes a metal, a metallic compound, metal oxide, metal nitride, metal carbide or a silicide, or combinations thereof. For example, the materials for the gate electrode 152 include tungsten (W), ruthenium (Ru), molybdenum (Mo), tantalum (Ta), titanium (Ti), alloys thereof, nitrides thereof, carbide thereof or combinations thereof. In some embodiments, the gate electrode 152 has a thickness ranging from about 20 nm to about 100 nm depending on design requirements. In some embodiments, the gate electrode 152 is formed through one or more processes of CVD, atomic layer deposition (ALD), physical vapor deposition (PVD), plating or other suitable methods. In one embodiment, the material of the gate electrode 152 includes tungsten formed by ALD or CVD. In some embodiments, a barrier layer (not shown) and/or an etch stop layer (not shown) may be formed on the dielectric structure 140 before forming the metallic layer.

In some embodiments, the patterning process for forming the gate electrode 152 includes forming a photoresist pattern (not shown) covering portions of the metallic layer through photolithography techniques and etching off the exposed portions of the metallic layer through an etching process to form the gate electrode 152. In some embodiments, the etching process includes a dry etching process.

Figure 4:
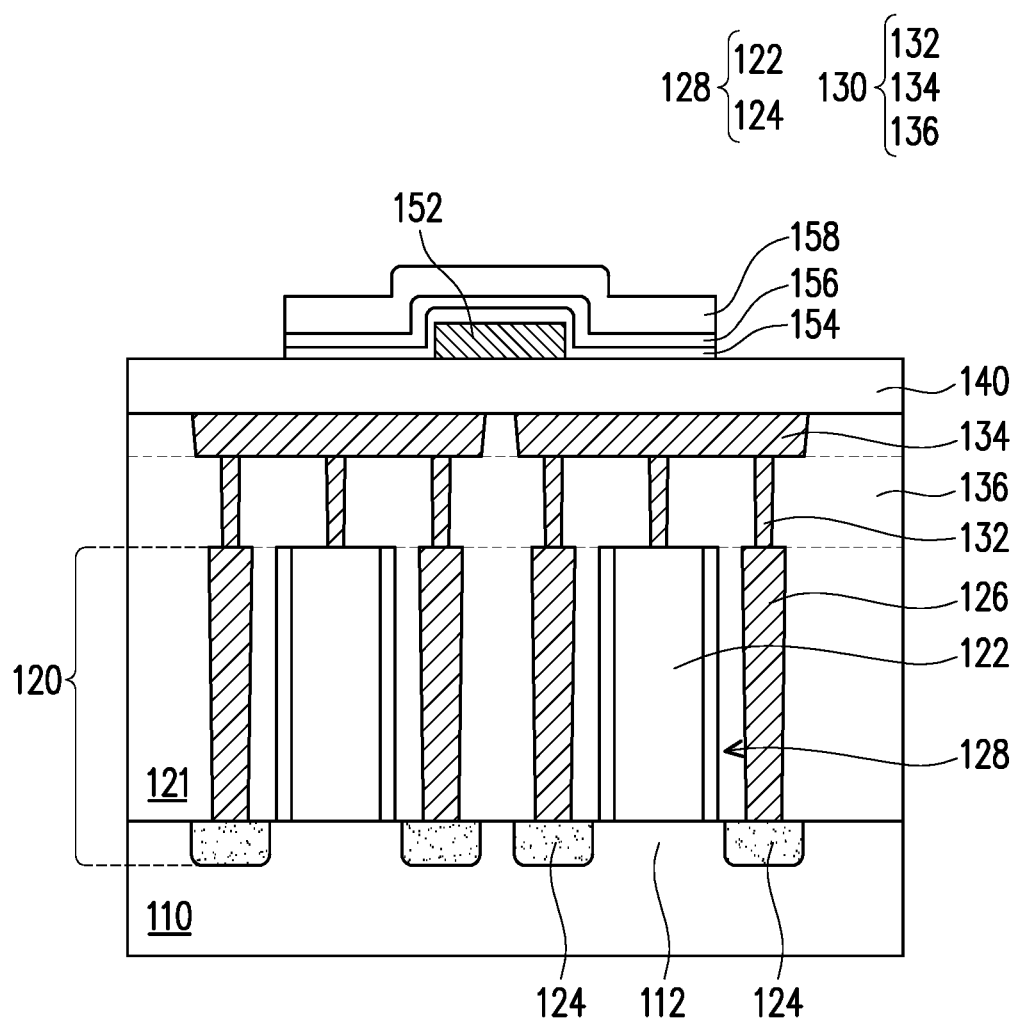

Referring to FIG. 4, a ferroelectric layer 154, a gate dielectric layer 156 and a channel layer 158 are sequentially formed on the gate electrode 152 and over the dielectric structure 140. In some embodiments, a ferroelectric material (not shown), a gate dielectric material (not shown) and a channel material (not shown) are blanketly formed in sequence over the dielectric structure 140 and fully covering the gate electrode 152. For example, the patterning process includes forming a photoresist pattern (not shown) over the channel material to define the regions to be removed, then etching off the underlying materials not covered by the photoresist pattern through suitable etching methods to expose the dielectric structure 140 and removing the photoresist pattern. Later, the ferroelectric material, the gate dielectric material and the channel material are patterned into the ferroelectric layer 154, the gate dielectric layer 156 and the channel layer 158 respectively. In some embodiments, the ferroelectric layer 154 is in contact with the gate electrode 152 and wraps around the top surface and the sidewalls of the gate electrode 152. The sidewalls of the stack structure of the ferroelectric layer 154, the gate dielectric layer 156 and the channel layer 158 in FIG. 4 may be shown to be vertically aligned or coplanar, and such stack structure may be shown to be patterned into substantially the same pattern design or configuration. However, it is understood that the various layers of the stack structure of the ferroelectric layer 154, the gate dielectric layer 156 and the channel layer may have different patterns or configurations depending on product designs. The ferroelectric material, the gate dielectric material and the channel material may be patterned through a single patterning process or multiple patterning processes.

In some embodiments, the ferroelectric material of the ferroelectric layer 154 includes $HfO_2$, $HfZrO_2$, or the like. In some embodiments, the ferroelectric material of the ferroelectric layer 154 includes $HfO_2$ doped with silicon, germanium (Ge), lanthanum (La), aluminum (Al), yttrium (Y), strontium (Sr) or zirconium (Zr) or the combinations thereof. In some embodiments, the ferroelectric material of the ferroelectric layer 154 includes $HfO_2$ doped with Ge or silicon. In some embodiments, the material of the ferroelectric layer 154 includes MN or AlScN. In some embodiments, the ferroelectric layer 154 is formed through one or more deposition processes selected from CVD (such as, plasma enhanced CVD and laser-assisted CVD), ALD and PVD (such as, sputtering and e-beam evaporation). In some embodiments, the ferroelectric layer 154 is formed with a thickness ranging from about 1 nm to about 50 nm. In some embodiments, when the material of the ferroelectric layer 154 is $HfO_2$, the ferroelectric layer 154 may be annealed by a rapid thermal annealing (RTA) process in ambient of nitrogen gas under about 400-800 degrees Celsius for 1-60 minutes to obtain better ferroelectric properties.

In some embodiments, the dielectric material of the gate dielectric layer 156 includes a high dielectric constant (K) material. In some embodiments, the high-K material may include metal oxide, for example, $SiO_2$, $GeO_2$, $HfO_2$, $ZrO_2$, $HfZrO_2$, $Ga_2O_3$, $Gd_2O_3$, $TaSiO_2$, $Al_2O_3$, or $TiO_2$ or combinations thereof. In one embodiment, the gate dielectric layer 156 includes silicon oxide, SiN, SiON, SiCN, SiOCN or aluminum oxide. In some embodiments, the gate dielectric layer 156 is formed by ALD, CVD, PVD or other suitable methods. In some embodiments, the gate dielectric layer 156 may be a single layer or a multi-layer structure. In some embodiments, the thickness of the gate dielectric layer 156 ranges between about 5 nm to about 500 nm.

In some embodiments, the channel layer 158 includes or is a metal oxide semiconductor layer. In some embodiments, the channel material of the channel layer 158 includes an indium-containing or gallium-containing metal oxide semiconductor material (e.g., indium-gallium-zinc oxide (IGZO), indium-zinc oxide (IZO), indium-tin oxide (ITO) or indium tungsten oxide (IWO)), a zinc-containing metal oxide semiconductor material (e.g., zinc oxide (ZnO), gallium-zinc oxide (GZO), zinc-tin oxide (ZTO) or combinations thereof) In some embodiments, the channel material may be formed by ALD, CVD, PVD or any other suitable methods. In some embodiments, the thickness of the channel layer 158 ranges between about 5 nm to about 500 nm.

Figure 5:
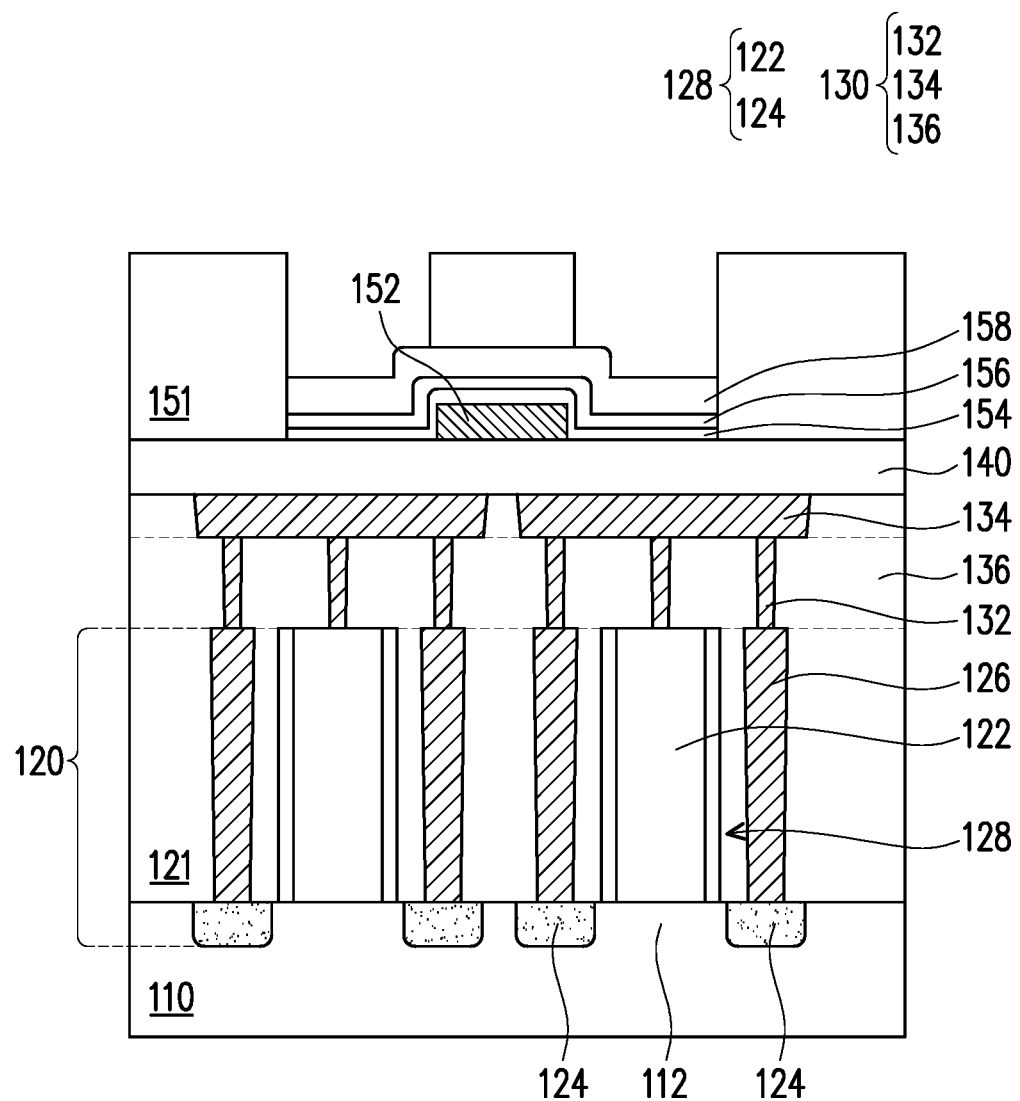

Referring to FIG. 5, a dielectric layer 151 is formed over the dielectric covering portions of the dielectric structure 140 and covering the stack structure of the ferroelectric layer 154, the gate dielectric layer 156 and the channel layer 158. The dielectric layer 151 is formed with openings to expose portions of the channel layer 158. In some embodiments, the material of the dielectric layer 151 includes silicon oxide, silicon nitride, silicon oxynitride, or a low-k dielectric material. The dielectric layer 151 may be formed by CVD, spin coating or other suitable methods.

Figure 6:
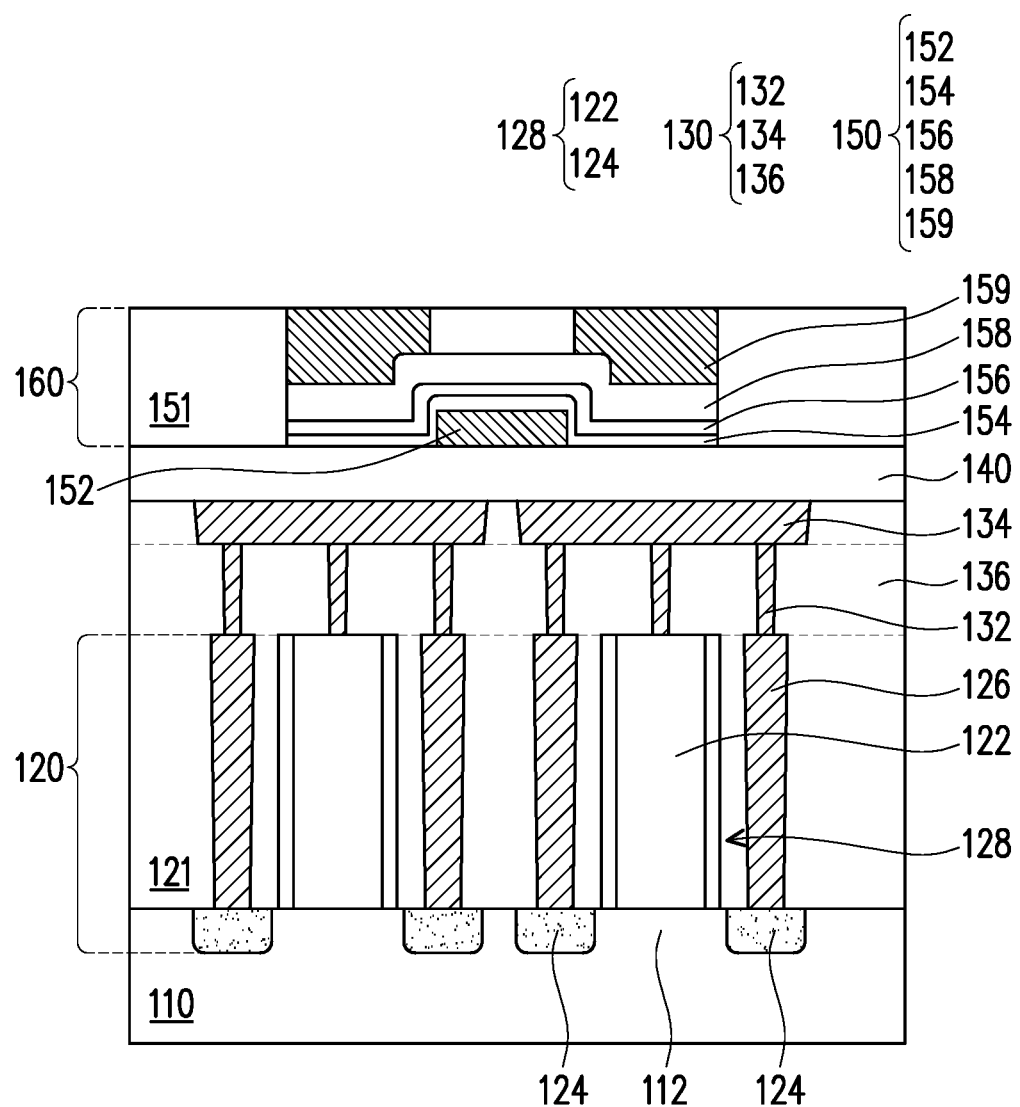

Referring to FIG. 6, source and drain regions 159 are formed within the openings of the dielectric layer 151 and on the exposed regions of the channel layer 158. As shown in FIG. 6, the source and drain regions 159 are located directly on the channel layer 158 and the channel layer 158 extends between the source and drain regions 159. In some embodiments, the ferroelectric layer 154, the gate dielectric layer 156 and the channel layer 158 are located below and extend between the source and drain regions 159. In FIG. 6, the outer sidewalls of the source and drain regions 159 may be shown to be vertically aligned or coplanar with the below stack structure of the ferroelectric layer 154, the gate dielectric layer 156 and the channel layer 158, it is possible that the source and drain regions 159 are formed with different pattern design or configuration. In some embodiments, the formation of the source and drain regions includes forming a metal layer (not shown) over the dielectric layer 151 and filling up the openings of the dielectric layer 151 by CVD, and then a planarization process is then performed to remove extra metal layer on the dielectric layer 151, so that the top surfaces of the dielectric layer 151 and the source and drain regions 159 are substantially coplanar after the planarization process. In some embodiments, the material of the metal layer includes copper, tungsten (W), molybdenum (Mo), aluminum (Al), or alloys thereof. The planarization process may be, for example, a chemical-mechanical polishing (CMP).

In FIG. 6, after the source and drain regions 159 are formed on the channel layer 158, a transistor layer 160 is formed and a thin film transistor (TFT) 150 including the gate electrode 152, the ferroelectric layer 154, the gate dielectric layer 156, the channel layer 158, and the source and drain regions 159, is completed. Although only one transistor 150 is shown in the transistor layer 160 in FIG. 6, two or more transistors 150 are formed in the transistor layer 160 following the previously described processes. Also, it is understood that multiple tiers of transistor layers 160 may be formed following the similar processes. In some embodiments, at least one thin film transistor 150 is a negative capacitance field effect transistor (NCFET). In some embodiments, the transistor 150 in the transistor layer 160 is electrically connected or coupled with the below semiconductor device(s) 128.

In FIG. 6, in the transistor 150, through forming the ferroelectric layer 154 between the gate electrode 152 and the gate dielectric layer 156, a metal-oxide-semiconductor capacitance (MOS CAP) is formed in the transistor 150 and a negative capacitance (NC) effect is generated. With the existence of the ferroelectric layer 154, the voltage across the gate dielectric layer 156 can be higher than the applied gate voltage when the transistor 150 (i.e. NCFET) is operated in the negative capacitance region, which may increase the on-current $I_{on}$ of the NCFET under the same gate voltage applied to the NCFET. As at least one transistor(s) 150 is a NCFET, the on-current ($I_{on}$) may be reached at a lower supply voltage ($V_{DD}$) and the power consumption is reduced. In some embodiments, the on-current $I_{on}$ of the transistor 150 (e.g. NCFET) may be increased by a factor of 2 to 10 under the same gate voltage.

For achieving the desired negative capacity of the NCFET, suitable materials of the ferroelectric layer 154 and the gate dielectric layer 156 are chosen and the thicknesses of the ferroelectric layer 154 and the gate dielectric layer 156 are finely tuned or modified depending on the desirable value of the negative capacity. By adjusting the materials and the combination(s) of the ferroelectric layer 154 and the gate dielectric layer 156, the negative capacitance effect may be fine-tuned to achieve the satisfactory performance. In some embodiments, the ratio of the thickness of the ferroelectric layer 154 and the gate dielectric layer 156 ranges between 0.1 to 1. In some alternative embodiments, the ratio of the thickness of the ferroelectric layer 154 and the gate dielectric layer 156 ranges between 10 to 1.

Figure 7:
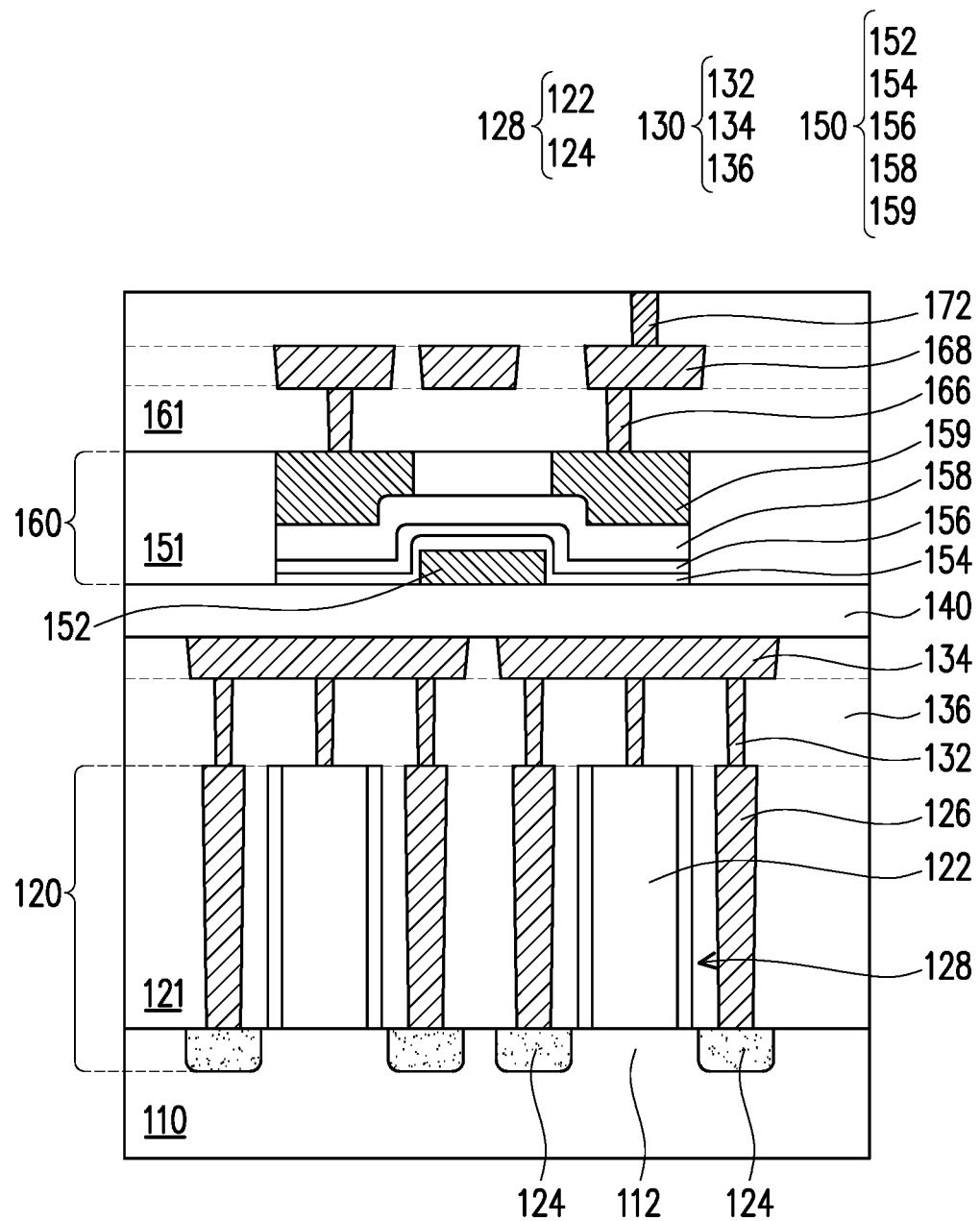

Referring to FIG. 7, a dielectric layer 161 and metallization structures including conductive vias 166, conductive lines 168 and conductive via 172 are formed. In some embodiments, multiple layers of dielectric pattern (not shown) are formed over the transistor layer 160 and the metallization structures including the conductive vias 166, the conductive lines 168 and the conductive via 172 are sequentially formed in the openings of different layers of the dielectric patterns. In some embodiments, one ends of the conductive vias 166 are formed on and connected with the source and drain regions 159 of the transistor 150 and the other ends of the conductive vias 166 are connected to the conductive lines 168. In some embodiments, the conductive via 172 is formed on and connected to the conductive lines 168. In some embodiments, the conductive vias 166, conductive lines 168 and conductive via 172 are embedded in the dielectric layer 161 with the top surface of the conductive via 172 exposed from the dielectric layer 161. In some embodiments, the number, pattern or configuration of the metallization structures are not limited to the drawings and may be modified depending on product designs.

In some embodiments, the material(s) of the metallization structures, such as the conductive vias 166 and 172 and the conductive lines 168, includes a metal, such as copper, titanium, tungsten, aluminum, or a combination thereof. The metallization structures may be formed by CVD or plating. In some embodiments, the material of the dielectric layer 161 includes silicon oxide, silicon nitride, silicon oxynitride, or one or more low-k dielectric materials. In some embodiments, the dielectric layer 161 is formed by CVD, spin-on coating, or other suitable methods. In some embodiments, the material of the dielectric layer 161 is the same as the material of the dielectric layer 151. In some embodiments, the material of the dielectric layer 161 is different from the material of the dielectric layer 151.

Figure 8:
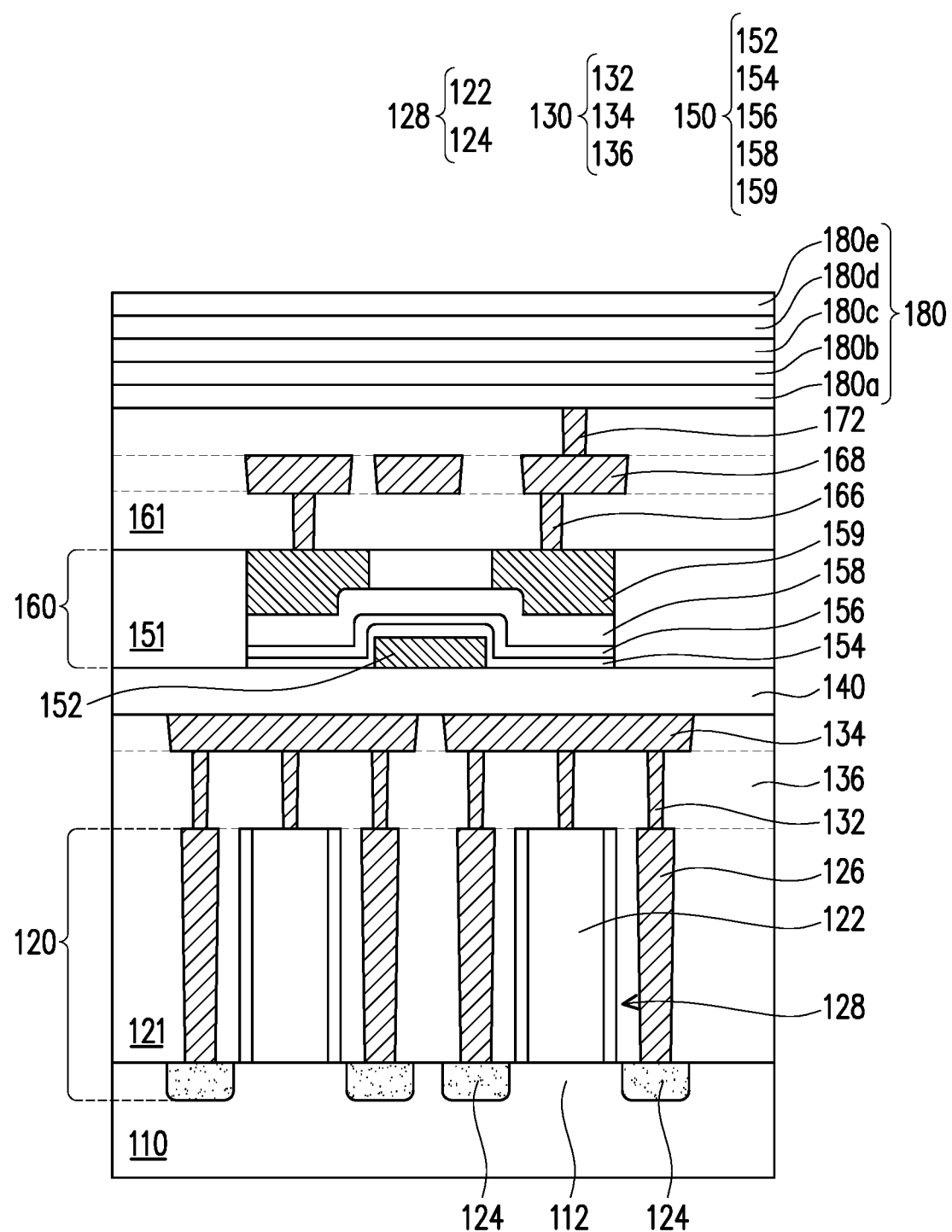
Figure 9:
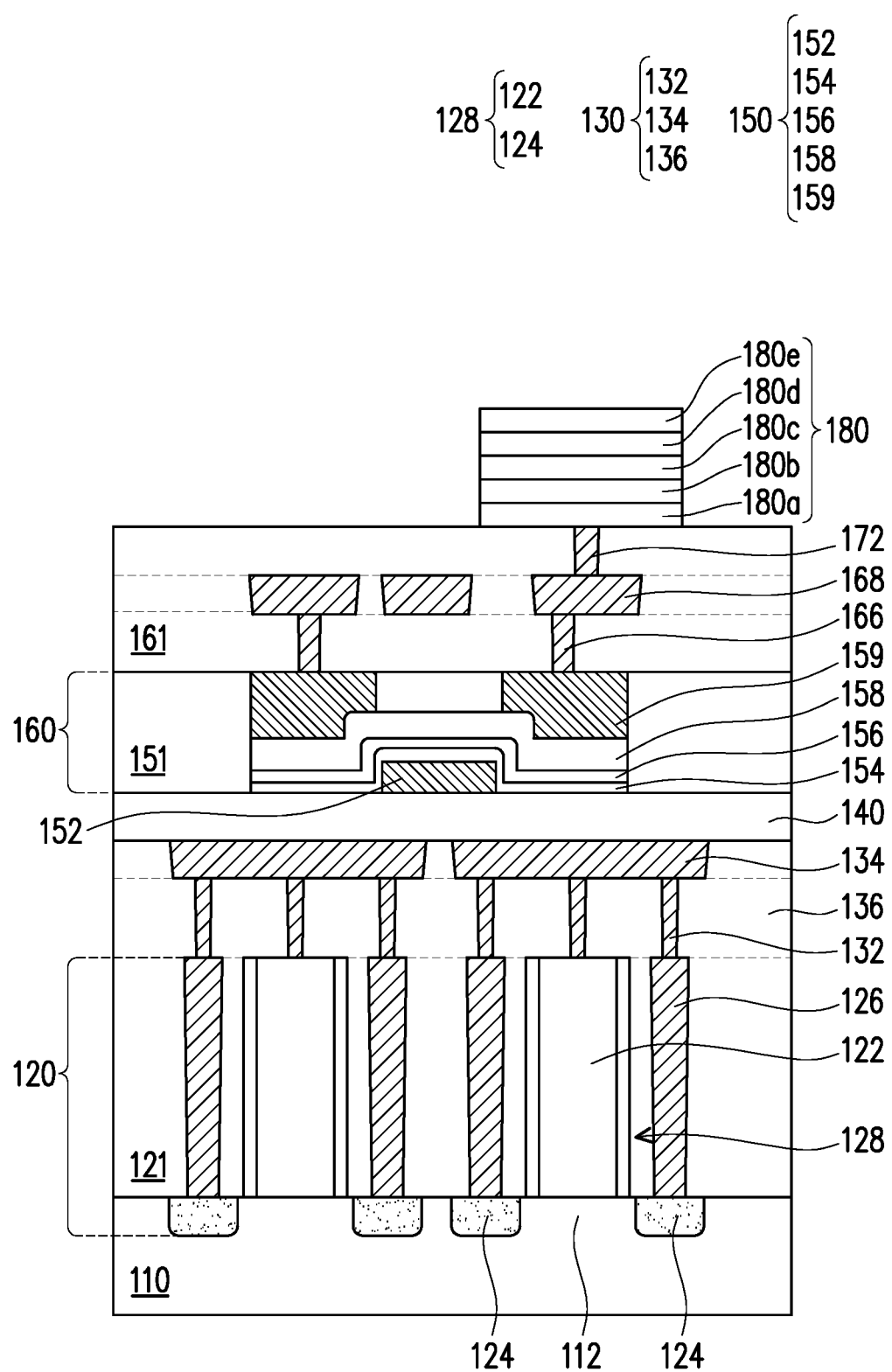

Referring to FIG. 8, a pinning layer 180a, a first ferromagnetic layer 180b, an insulating layer 180c, a second ferromagnetic layer 180d, and a top electrode layer 180e are formed on the dielectric layer 161 and covering the exposed conductive via 172. In some embodiments, the stacked layers of the pinning layer 180a, the first ferromagnetic layer 180b, the insulating layer 180c, the second ferromagnetic layer 180d, and the top electrode layer 180e may be sequentially and blanketly formed over the dielectric layer 161. Referring to FIG. 9, the stacked layers of the pinning layer 180a, the first ferromagnetic layer 180b, the insulating layer 180c, the second ferromagnetic layer 180d, and the top electrode layer 180e are patterned into a magnetic tunnel junction (MTJ) stack 180.

In some embodiments, the MTJ stack 180 includes at least two or more ferromagnetic layers and at least one insulating layer. In some embodiments, the MTJ stack 180 includes a pinning layer 180a, a first ferromagnetic layer 180b, an insulating layer 180c, a second ferromagnetic layer 180d, and the top electrode layer 180e. The first ferromagnetic layer 180b may also be referred to as a fixed layer, a reference layer, or a pinned layer. The second ferromagnetic layer 180d may also be referred to as a free layer.

In some embodiments, the pinning layer 180a is made of an anti-ferromagnetic (AFM) material. Anti-ferromagnetic materials are those in which the magnetic moments of atoms or molecules align such that a pattern is formed wherein neighboring atoms or molecules have spins pointing in opposite directions. In some embodiments, the material of the pinning layer 180a includes platinum manganese (PtMn), iridium manganese (IrMn), rhodium manganese (RhMn) or iron manganese (FeMn), or combinations thereof. In some embodiments, the pinning layer 180a may be formed using physical vapor deposition (PVD) or other suitable methods.

In some embodiments, the first ferromagnetic layer 180b is formed on the pinning layer 180a. The first ferromagnetic layer 180b may also referred as a reference layer. The first ferromagnetic layer 180b, or, in some embodiments, also referred as pinned layer, has a magnetic moment that is "pinned" in a particular direction by the anti-ferromagnetic pinning layer 180a. Thus, the first ferromagnetic layer 180b does not change its magnetic moment during operation of the MTJ device. In some embodiments, the material of the first ferromagnetic layer 180b includes CoFeB, CoFeTa, NiFe, Co, CoFe, CoPt, CoPd, FePt, or other alloys of Ni, Co and Fe, or combinations thereof. In some embodiments, the first ferromagnetic layer 180b may be formed by PVD or any other suitable deposition methods.

In some embodiments, the insulating layer 180c is formed on the first ferromagnetic layer 180b. The insulating layer 180c may be formed of an electrically resistive material, such as an oxide material. In some embodiments, the material of the insulating layer 180c may include magnesium (Mg), magnesium oxide, aluminum oxide, aluminum nitride (AlN), aluminum oxynitride (AlON), or a combination thereof. In some embodiments, the insulating layer 180c may be formed by PVD or any other suitable deposition methods. The thickness of the insulating layer 180c may range from about 5 angstroms to about 15 angstroms.

In some embodiments, the second ferromagnetic layer 180d is formed on the insulating layer 180c. In some embodiments, the second ferromagnetic layer 180d, or free layer, is also made of a ferromagnetic material. Unlike the first ferromagnetic layer 180b, the magnetic moment direction of the second ferromagnetic layer 180d, or the free layer 180d, can change under various conditions during operation of the MTJ device because there is no pinning layer 180a adjacent to the free layer 180d. In some embodiments, the materials and the forming method of the second ferromagnetic layer 180d are similar to the materials and the forming method of the first ferromagnetic layer 180b, and the descriptions shall not be repeated herein.

In some embodiments, the top electrode layer 180e is formed onto the free layer 180d. In some embodiments, the top electrode layer 180e may be made of a suitable conductive material, such as titanium (Ti), tantalum (Ta), platinum (Pt) or ruthenium (Ru), or the like. In some embodiments, the top electrode layer 180e may be formed by plating, CVD or PVD, or another suitable process.

Since the pinning layer 180a is not close to the free layer 180d in the MTJ stack 180, the magnetic moment direction of the free layer 180d can change under various conditions during operation of the MTJ stack 180. In some embodiments, the second ferromagnetic layer 180d is capable of changing its magnetization direction between one of two magnetization states under applied external magnetic fields, which correspond to binary data states stored in the MTJ stack 180.

For example, the first ferromagnetic layer 180b, or the reference layer may have an "up" magnetization direction. In a first state, the second ferromagnetic layer 180d can have an "up" magnetization direction in which is parallel, or in the same direction with the magnetization direction of the first ferromagnetic layer 180b, or the reference layer 180b. In this first state, or the parallel state, the MTJ stack 180 has a relatively low resistance. The electrons can more readily tunnel through the insulating layer 180c. Thus, with a properly polarized voltage applied, an electric current can flow through the MTJ stack 180 between the underlying conductive via 172 and above top electrode layer 180e.

In a second state, the second ferromagnetic layer 180d can have a "down" magnetization direction which is aligned and is anti-parallel with the magnetization direction of the first ferromagnetic layer 180b. In this second state, or the anti-parallel state, the MTJ stack 180 has a resistance higher than the resistance when the second ferromagnetic layer 180d has an "up" magnetization direction. The electrons in this second state are more unlikely to tunnel through the insulating layer 180c compared to the first state.

Figure 10:
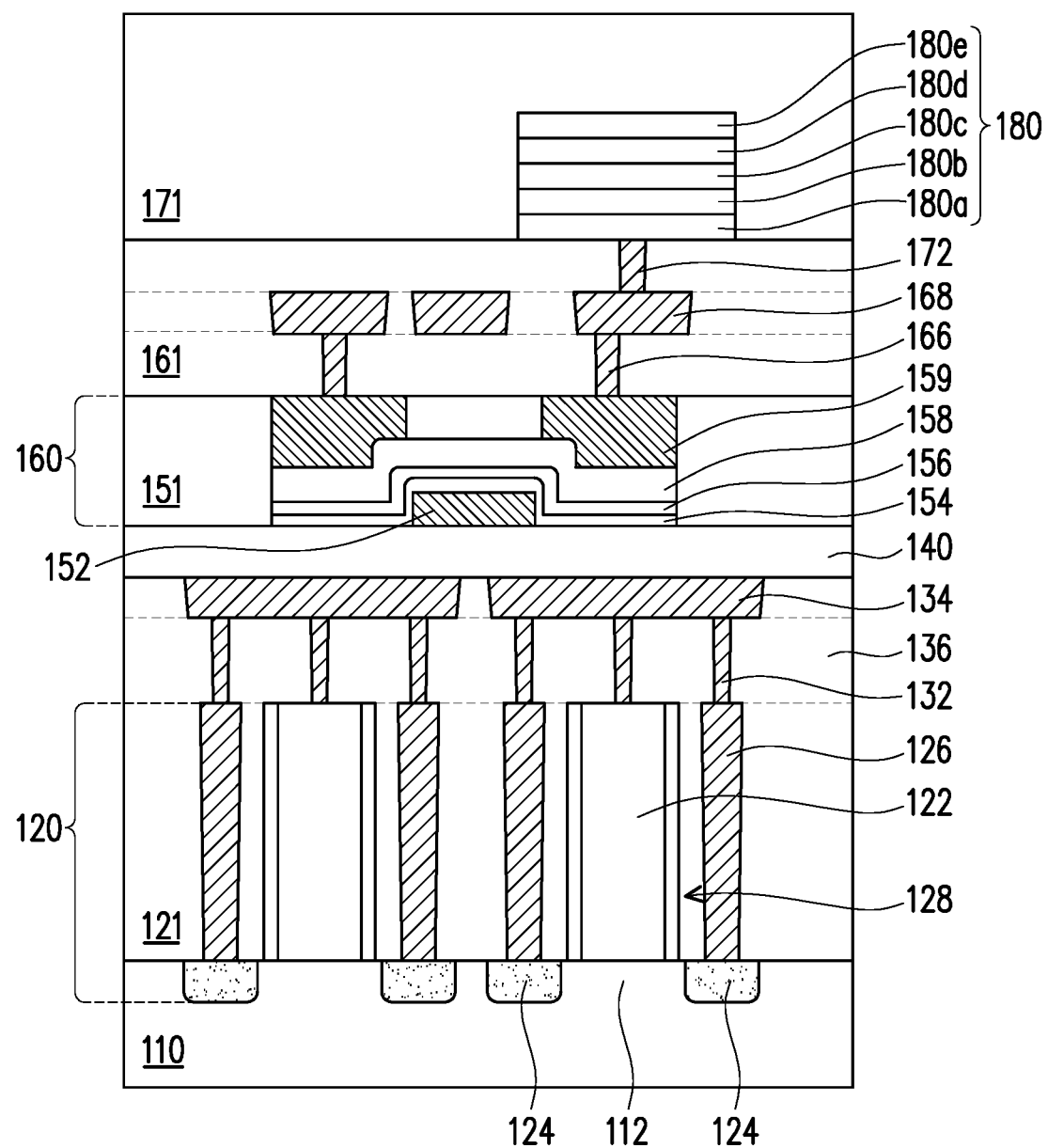

Referring to FIG. 10, a dielectric layer 171 is formed over the dielectric layer 161 and encloses the MTJ stack 180. The materials and the forming process of the dielectric layer 171 are similar to the materials and the forming process of the dielectric layers 151 and 161, therefore the details are not repeated herein.

Figure 11:
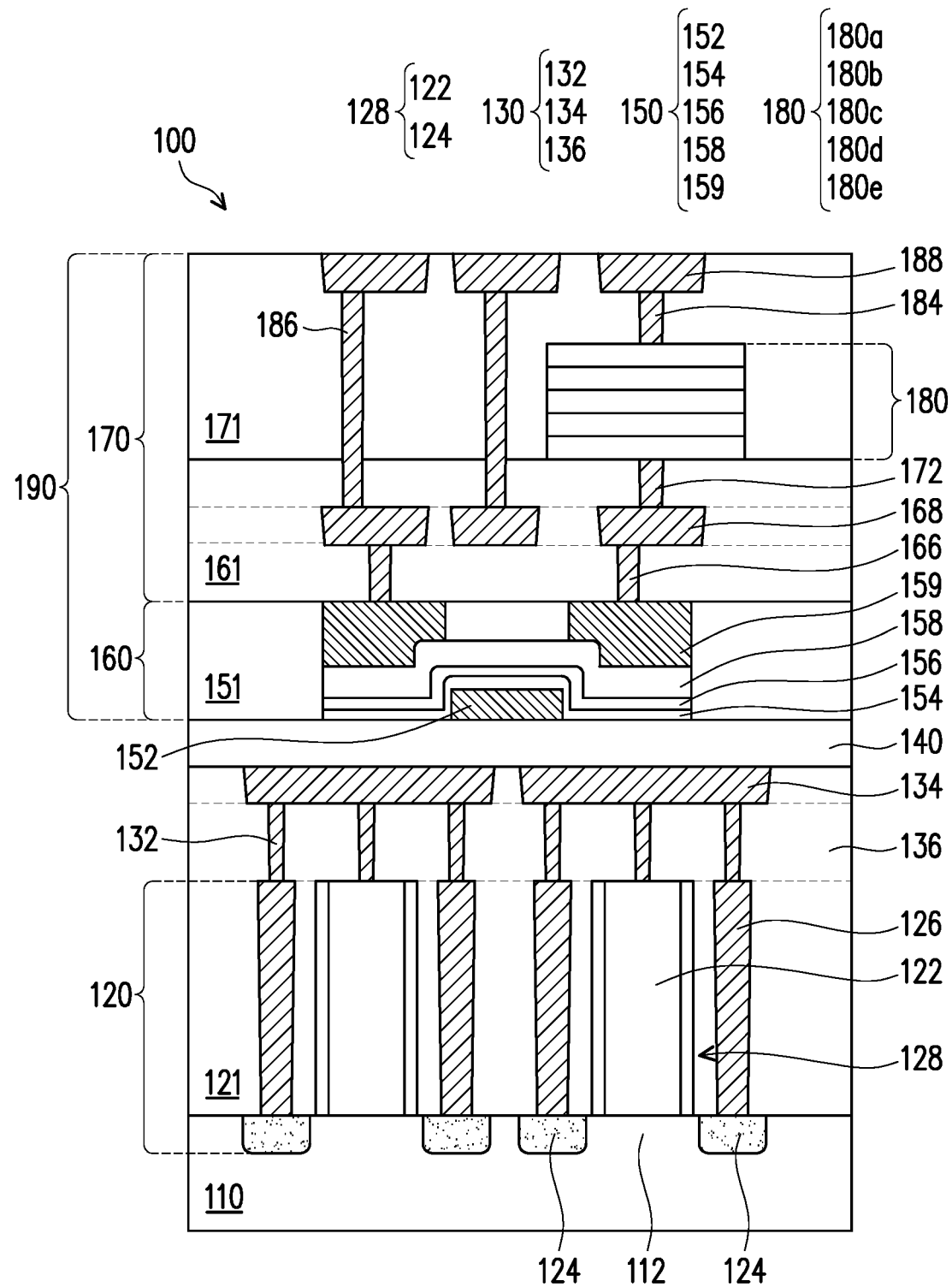

Referring to FIG. 11, more metallization structures including conductive vias 184 and 186 and conductive lines 188 are formed in the dielectric layers 161 and 171. For example, via holes and openings are formed in the dielectric layers 161 and 171 and conductive vias 184 and 186 and conductive lines 188 are later formed within the via holes and openings. In some embodiments, the top electrode layer 180e of the MTJ stack 180 are connected with the conductive via 184 and conductive line 188, and the pinning layer 180a is connected with the conductive via 172 and further electrically connected with the below transistor 150 through the conductive lines 168 and conductive via 166. In FIG. 11, one of the conductive lines 188 is coupled to one of the source and drain regions 159 of the transistor 150 through the conductive vias 186, the conductive lines 168, and the conductive vias 166. In some embodiments, the conductive via 184 connecting the top electrode layer 180e and the conductive line 188 is referred to as an MTJ top via 184. In one embodiment, the MTJ stack 180 is electrically connected to the drain region 159 of the transistor 150. In some embodiments, the formation of the metallization structures uses the back-end-of-line (BEOL) processes. In some embodiments, similar to the back-end-of-line processes for forming the interconnection structure 130, the metallization structures formed in the dielectric layers 161 and 171 together with the dielectric structure 140 may be considered as part of BEOL interconnecting structures.

In some embodiments, in FIG. 11, a memory layer 170 is formed including the dielectric layers 161 and 171, the metallization structures such as the conductive vias 166, 172, 184 and 186, the conductive lines 168, 188 and the MTJ stack 180. In FIG. 11, the transistor 150 in the transistor layer 160 and the MTJ stack 180 of the memory layer 170 together form a MRAM device 190. In the above embodiments, the MRAM device 190 formed in the transistor layer 160 and the memory layer 170 are fabricated by the back-end-of-line (BEOL) processes and may be considered as BEOL-compatible memory devices.

FIG. 12 to FIG. 15 are schematic cross-sectional views showing memory structures according to various exemplary embodiments of the present disclosure.

Figure 12:
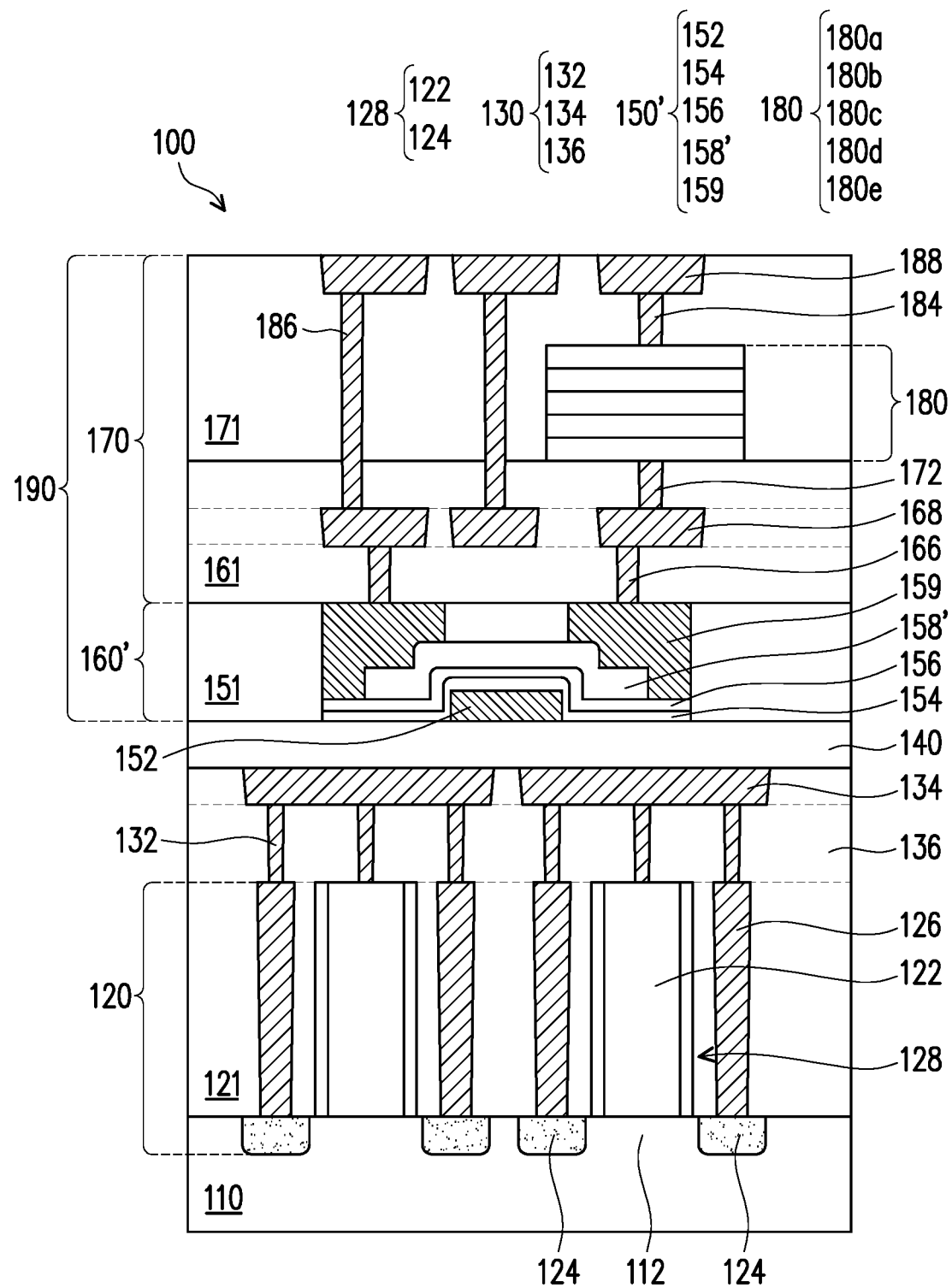
FIG. 12 to FIG. 15 are schematic cross-sectional views illustrating memory structures according to various exemplary embodiments of the present disclosure.

The memory structure shown in FIG. 12 is similar to but different from the structure shown in FIG. 11, and the main structural difference lies in that the structure of the transistor. Referring to FIG. 12, in some other embodiments, the transistor 150' in the transistor layer 160' is a NCFET. The same or similar elements or device may be labeled with the same or similar reference labels. Similar to the transistor 150, the transistor 150' is also a bottom gate FET, as the gate electrode 152 is located at the bottom of the transistor 150' (i.e. NCFET). In FIG. 12, the channel layer 158' of the transistor 150' is separately patterned and has a different pattern from the underlying gate dielectric layer 156 and the ferroelectric layer 154 so that the source and drain regions 159 are in contact with the exposed portions of the gate dielectric layer 156. In FIG. 12, the source and drain regions 159 physically contact the gate dielectric layer 156 and the channel layer 158'. A larger contact area between the channel layer 158' and the source and drain regions 159 of the transistor 150' leads to better connection between the channel layer 158' and the source and drain regions 159.

In some embodiments, the memory cell formed in the memory layer may include other types of capacitors or storage structures. That is, the MTJ stack 180 of the MRAM device 190 may be replaced by other type of devices, such as the ferroelectric tunnel junction (FTJ) stack, as shown in FIG. 13.

In some embodiments, the structure of the ferroelectric tunnel junction (FTJ) includes at least one ferroelectric layer and two or more metal layers. For example, the FTJ may be a tunnel junction in which two metal electrodes are separated by a thin ferroelectric layer. The spontaneous polarization of the ferroelectric layer can be switched by an applied electric field. The electrical resistance of an FTJ strongly depends on the orientation of the electric polarization. When coupled with the transistor such as NCFET, the NCFET may provide a larger $I_{on}$ to the FTJ to clearly distinguish the voltage across the FTJ under different resistance states of the FTJ.

Figure 13:
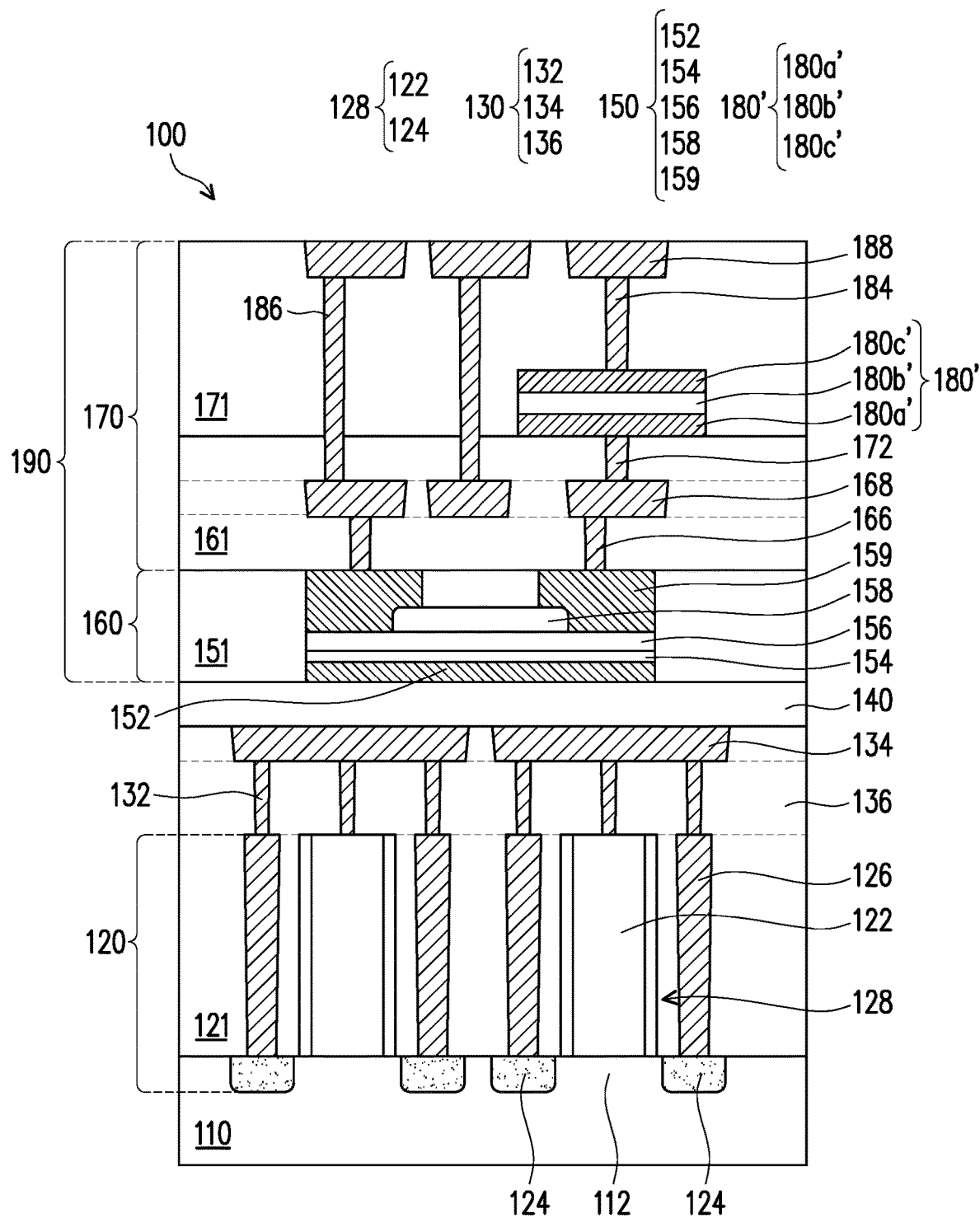

The memory structure shown in FIG. 13 is similar to but different from the structure shown in FIG. 11, and the main structural difference lies in that the structure of the memory cell. Referring to FIG. 13, in some embodiments, the memory cell includes a ferroelectric tunnel junction stack 180' in the memory layer 170. The same or similar elements or device may be labeled with the same or similar reference labels. As shown in FIG. 13, in some embodiments, the FTJ stack 180' includes a lower electrode 180a', which is a first electrode or a bottom electrode, a resistive switching layer 180b', and an upper electrode 180c', which is a second electrode or a top electrode. The FTJ stack 180' may have two or more states with different electric resistance values. Each state may represent a different digital value. The FTJ stack 180' may switch from one state to another by applying a predetermined voltage or current to the FTJ stack 180'. For example, the FTJ stack 180' has a state of relatively high resistance, referred to as "a high resistance state", and a state of relatively low resistance, referred to as "a low resistance state". The FTJ stack 180' may be switched from the high resistance state to the low resistance state, or from the low resistance state to high resistance state by applying a predetermined voltage or current.

In FIG. 13, the transistor 150 in the transistor layer 160 and the FTJ stack 180' of the memory layer 170 together form a FeRAM device 190. In some embodiments, in FIG. 13, the bottom electrode 180a' is formed on the dielectric layer 161 and connects with the conductive via 172. In some embodiments, the bottom electrode 180a' is electrically connected to one of the source and drain regions 159 of the transistor 150. In one embodiment, the bottom electrode 180a' may further include a barrier layer formed on the dielectric layer 161. In some embodiments, the material of the bottom electrode 180a' or the top electrode 180c' may include one or more of copper (Cu), tantalum (Ta), tungsten (W), gold (Au), platinum (Pt), ruthenium (Ru), iridium (Ir), titanium (Ti), aluminum (Al), alloys thereof, or oxide, nitride, carbide, or silicide thereof. In some embodiments, the material of the bottom electrode 180a' or the top electrode 180c' includes indium-tin oxide (ITO). In some embodiments, the material of the bottom electrode 180a' or the top electrode 180c' may include TaN, TiN, TiAlN, TiW or combinations thereof. The thickness of the bottom electrode 180a' or the top electrode 180c' may be between a range about 5 nm to about 500 nm. In some embodiments, the bottom electrode 180a' or the top electrode 180c' is formed by CVD, ALD, PVD or other suitable methods.

In some embodiments, the resistive switching layer 180b' is formed on the bottom electrode 180a' and directly contacts the bottom electrode 180a'. In some embodiments, the material for the resistive switching layer 180b' includes a composite layer of a metallic layer and a silicon oxide or metal oxide layer. The resistive switching layer 180b' may include W, Ta, Ti, Ni, Co, Hf, Ru, Zr, Zn, Fe, Sn, Al, Cu, Ag, Mo, Cr, oxide thereof, nitride thereof, or combinations thereof. The thickness of the resistive switching layer 180b' may be between a range about 1 nm to about 100 nm.

Figure 14:
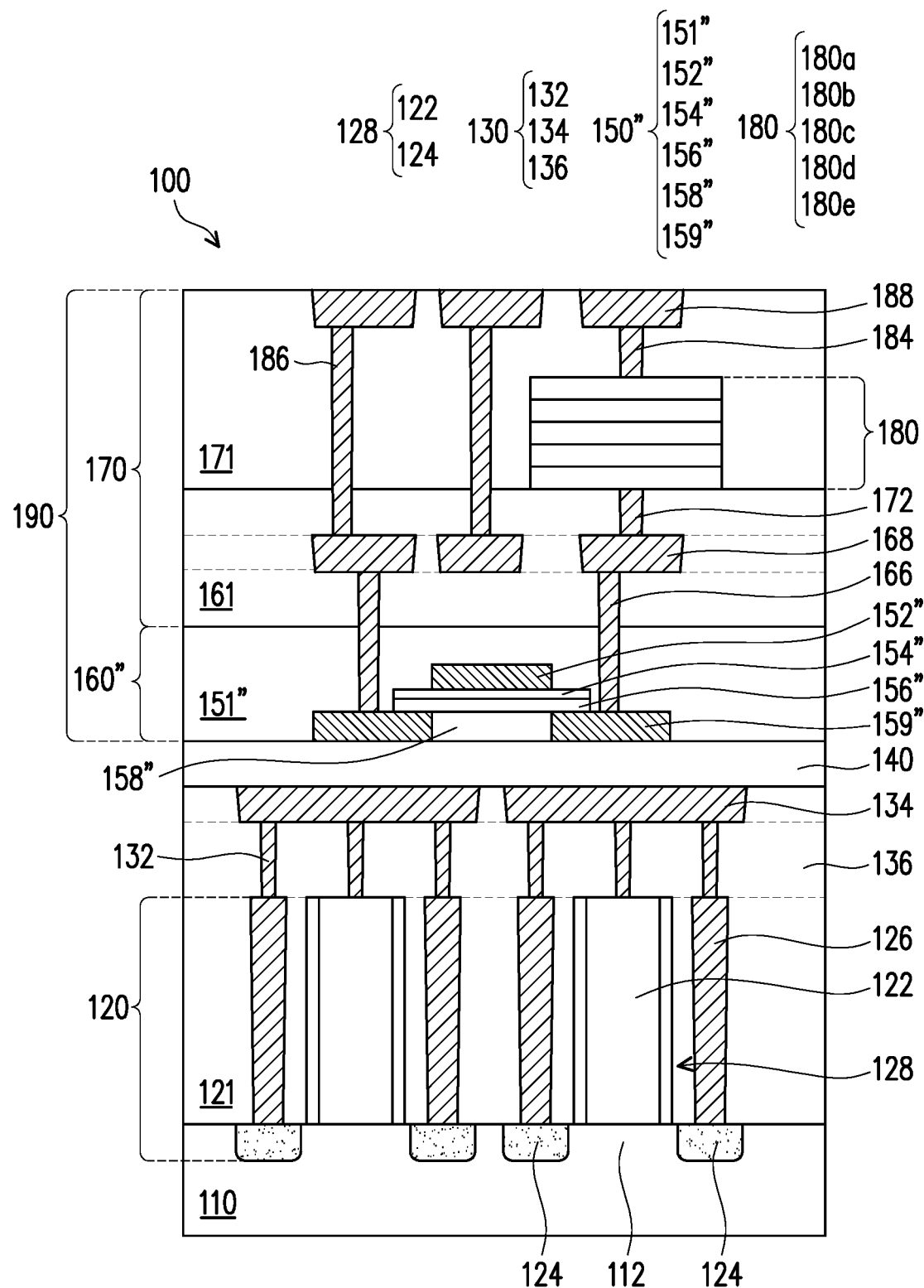

The memory structure shown in FIG. 14 is similar to but different from the structure shown in FIG. 11, and the main structural difference lies in that the structure of the transistor. Referring to FIG. 14, in some embodiments, the transistor 150" in the transistor layer 160" includes a top gate FET embedded in the dielectric layer 151". In some embodiments, the transistor 150" is a top gate NCFET. In FIG. 14, the layer arrangement of the top gate NCFET 150" is different and in reverse from the layer arrangement of the bottom gate NCFET, but the suitable arrangement or configuration of the top gate NCFET is not limited thereto.

In some embodiments, as shown in FIG. 14, the source and drain regions 159" on the dielectric structure 140 are formed on two opposite sides of the channel layer 158" on the dielectric structure 140. In some embodiments, the stack of the gate dielectric layer 156" and the ferroelectric layer 154" is formed on the channel layer covering the top surface of the channel layer 158" and partially covering top surfaces of the source and drain regions 159". In some embodiments, the gate electrode 152" is formed on the ferroelectric layer 154". As shown in FIG. 14, the width of the ferroelectric layer 154" is larger than the width of the gate electrode 152". In some embodiments, the width of the ferroelectric layer 154" may be substantially the same as the width of the gate electrode 152". In FIG. 14, in some embodiments, the conductive vias 166 connect the source and drain regions 159" and the conductive lines 168.

Figure 15:
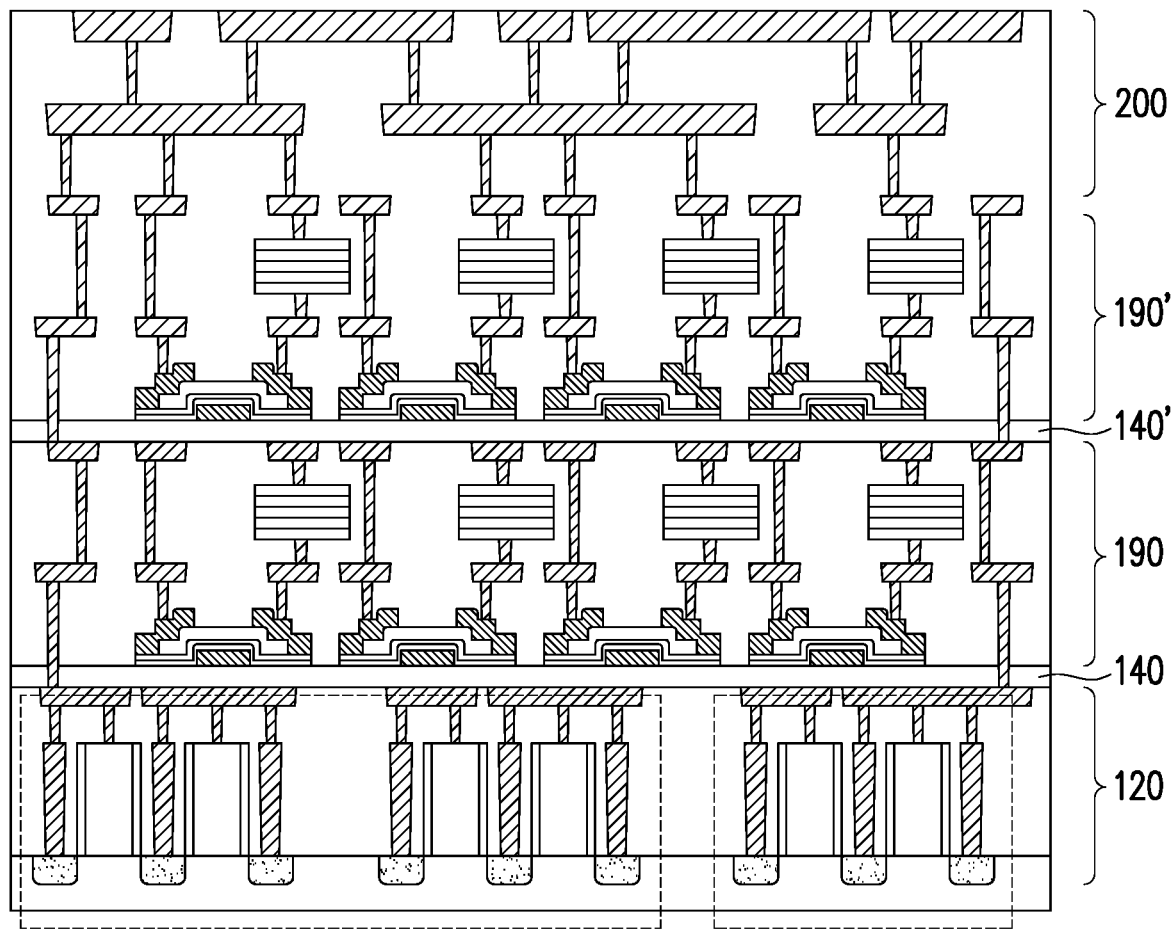

Referring to FIG. 15, a multiple-tier structure of the memory device is illustrated. In some embodiments, the first tier of the structure includes the dielectric structure 140 and the memory device 190, and the first tier may be formed following the previous processes described in the above embodiments. After the formation of the first tier, a second tier is formed by forming a dielectric structure 140' on the first tier and forming a second layer or tier memory device 190' (e.g. MRAM device) on the dielectric structure 140'. The second tier may be formed by repeating the manufacturing processes for forming the first tier or following the previous processes described in the above embodiments. For example, the MRAM devices 190' may include at least one transistor (e.g. a top gate NCFET 150, and/or a bottom gate NCFET) disposed on the dielectric structure 140', and a memory cell (e.g. an MTJ stack or an FTJ stack) electrically connected with the transistor. In some embodiments, a redistribution layer 200 is formed over the memory device 190'. The redistribution layer 200 is electrically connected with the below memory devices 190' and 190, and the device layer 120. For example, the memory device includes a transistor, such as the NCFET 150 of the transistor layer 160 in FIG. 1, and a memory cell, such as the MJT stack 180 of the memory layer 170 in FIG. 1.

As the transistor in the memory device is a NCFET with the ferroelectric layer located between the gate electrode and the gate dielectric layer, the current $I_{on}$ of the NCFET of the memory device may be increased by a factor of about 2 to about 10 under the same operation voltage of the NCFET, which significantly increases the voltage across the memory cell, and leads to better performance of the memory device.

According to some embodiments, a memory device is provided. The memory device includes a substrate, a transistor, and a memory cell. The substrate has a semiconductor device and a dielectric structure being disposed on the semiconductor device. The transistor is disposed over the dielectric structure and is electrically coupled with the semiconductor device. The semiconductor device includes a gate, a channel layer, a stack of a gate dielectric layer and a first ferroelectric layer and source drain regions. The gate is disposed over the dielectric structure. The source and drain regions are disposed over the dielectric structure. The channel layer is located between the source and drain regions. The stack of the gate dielectric layer and the first ferroelectric layer is disposed between the gate and the channel layer. The memory cell is disposed over the transistor and is electrically connected to one of the source and drain regions of the transistor. The memory cell includes a ferromagnetic layer or a second ferroelectric layer.

According to some embodiments, a memory structure is provided. A memory structure, includes a substrate, a first tier, and a second tier. The substrate has semiconductor devices and a dielectric structure being disposed on the semiconductor devices. The first tier is disposed on the dielectric structure and is electrically coupled with at least one of the semiconductor devices. The first tier includes a first transistor being disposed on the dielectric structure and a first memory cell being electrically connected with the first transistor. The second tier is disposed on the first tier and over the dielectric structure, and is electrically coupled with at least one of the semiconductor devices. The second tier includes a second transistor disposed on the first tier and over the dielectric structure. The second memory cell is electrically connected with the second transistor. The first transistor includes a first ferroelectric layer, and the second transistor includes a second ferroelectric layer. The first memory cell includes a first magnetic tunnel junction stack or a first ferroelectric tunnel junction stack, and the second memory cell includes a second magnetic tunnel junction stack or a second ferroelectric tunnel junction stack.

According to some embodiments, a method of forming a memory device is provided. A substrate having a semiconductor device is provided. A dielectric structure is formed over the semiconductor device. A transistor is formed on the dielectric structure and over the semiconductor device. The transistor is formed with a ferroelectric layer therein. A magnetic tunnel junction stack or a ferroelectric tunnel junction stack is formed over the transistor, and the magnetic tunnel junction stack or the ferroelectric tunnel junction stack is electrically connected to the transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a substrate, having a semiconductor device and a dielectric structure disposed on the semiconductor device;
   a transistor, disposed over the dielectric structure and electrically coupled with the semiconductor device, comprising:
   a gate disposed over the dielectric structure;
   source and drain regions disposed over the dielectric structure;
   a channel layer located between the source and drain regions; and
   a stack of a gate dielectric layer and a first ferroelectric layer disposed between the gate and the channel layer, wherein the stack of the gate dielectric layer and the first ferroelectric layer conformally covers a top surface and sidewalls of the gate, wherein the first ferroelectric layer is in direct contact with the top surface and the sidewalls of the gate; and
   a memory cell, disposed over the transistor and electrically connected to one of the source and drain regions of the transistor, wherein the memory cell includes a ferromagnetic layer or a second ferroelectric layer.

2. The memory device of claim 1, wherein a material of the first ferroelectric layer comprises $HfO_2$ or $HfO_2$ doped with silicon (Si), germanium (Ge), lanthanum (La), aluminum (Al), yttrium (Y), strontium (Sr), or zirconium (Zr) or a combination thereof.

3. The memory device of claim 1, wherein a material of the second ferroelectric layer comprises $HfO_2$ or $HfO_2$ doped with Si, Ge, La, Al, Y, Sr, or Zr or a combination thereof, and a material of the ferromagnetic layer includes CoFeB, CoFeTa, NiFe, Co, CoFe, CoPt, CoPd, FePt, or an alloy of Ni, Co and Fe.

4. The memory device of claim 1, wherein the source and drain regions are in direct contact with a top surface of the channel layer.

5. The memory device of claim 4, wherein the first ferroelectric layer extends below the source and drain regions.

6. The memory device of claim 1, wherein the memory cell includes a magnetic tunnel junction stack of two or more ferromagnetic layers and at least one insulating layer.

7. The memory device of claim 1, wherein the first ferroelectric layer has a thickness thinner than or equivalent to a thickness of the gate dielectric layer of the transistor.

8. The memory device of claim 1, wherein the memory cell includes from bottom to top:
   a pinning layer;
   a first ferromagnetic layer over the pinning layer;
   an insulating layer over the first ferromagnetic layer;
   a second ferromagnetic layer over the insulating layer; and
   a top electrode layer over the second ferromagnetic layer.

9. A method of forming a memory device, comprising:
   providing a substrate having a semiconductor device;
   forming a dielectric structure over the semiconductor device;
   structure and over the forming a transistor on the dielectric semiconductor device, wherein the forming a transistor includes:
      forming a gate over the dielectric structure;
      forming a stack of a gate dielectric layer and a first ferroelectric layer to conformally cover a top surface and sidewalls of the gate, wherein the first ferroelectric layer is in direct contact with the top surface and the sidewalls of the gate;
      forming a channel layer on the stack of a gate dielectric layer and a first ferroelectric layer; and
      forming source and drain regions on opposite sides of the channel layer; and
   forming a memory cell over the transistor to be electrically connected to one of the source and drain regions of the transistor, wherein the memory cell includes a ferromagnetic layer or a second ferroelectric layer.

10. The method of claim 9, wherein the first ferroelectric layer is in contact with the gate and laterally wraps around the gate of the transistor.

11. The method of claim 10, wherein the first ferroelectric layer extends below the source and drain regions.

12. The method of claim 9, wherein a sidewall of the channel layer is substantially aligned with a sidewall of the stack of the gate dielectric layer and the first ferroelectric layer.

13. A memory device, comprising:
   a substrate, having a semiconductor device and a dielectric structure disposed on the semiconductor device;
   a transistor, disposed over the dielectric structure and electrically coupled with the semiconductor device, comprising:
      a gate disposed over the dielectric structure;
      source and drain regions disposed over the dielectric structur;
      a channel layer located between the source and drain regions, wherein a material of the source and drain regions being in direct contact with the channel layer is a metal material, and the channel layer and the source and drain regions have different materials; and
      a stack of a gate dielectric layer and a first ferroelectric layer disposed between the gate and the channel layer, wherein the channel layer has a top surface away from the substrate in direct contact with a bottom surface of the gate dielectric layer, wherein the stack of the gate dielectric layer and the first ferroelectric layer overlays the top surface of the channel layer, and extends to cover a portion of a top surface of the source and drain regions; and
   a memory cell, disposed over the transistor and electrically connected to one of the source and drain regions of the transistor, wherein the memory cell includes a ferromagnetic layer or a second ferroelectric layer.

14. The memory device of claim 13, wherein a material of the first ferroelectric layer comprises $HfO_2$ or $HfO_2$ doped with silicon (Si), germanium (Ge), lanthanum (La), aluminum (Al), yttrium (Y), strontium (Sr), or zirconium (Zr) or a combination thereof.

15. The memory device of claim 13, wherein a material of the ferromagnetic layer includes CoFeB, CoFeTa, NiFe, Co, CoFe, CoPt, CoPd, FePt, or an alloy of Ni, Co and Fe.

16. The memory device of claim 13, wherein the source and drain regions is disposed on and in direct contact with opposite sides of the channel layer.

17. The memory device of claim 13, wherein the channel layer is a metal oxide semiconductor layer.

18. The memory device of claim 13, wherein the memory cell includes a magnetic tunnel junction stack of two or more ferromagnetic layers and at least one insulating layer.

19. The memory device of claim 13, wherein the first ferroelectric layer has a thickness thinner than or equivalent to a thickness of the gate dielectric layer of the transistor.

20. The memory device of claim 13, wherein the channel layer and the source and drain regions have the same thickness, and the memory cell includes from bottom to top:
   a pinning layer;
   a first ferromagnetic layer over the pinning layer;
   an insulating layer over the first ferromagnetic layer;
   a second ferromagnetic layer over the insulating layer; and
   a top electrode layer over the second ferromagnetic layer.

* * * * *